United States Patent [19]
Levy et al.

[11] Patent Number: 5,869,353
[45] Date of Patent: Feb. 9, 1999

[54] MODULAR PANEL STACKING PROCESS

[75] Inventors: Aaron Uri Levy, Stanton; John Patrick Sprint, Huntington Beach; John Arthur Forthun, Glendora; Harlan Ruben Isaak, Costa Mesa; Joel Andrew Mearig; Mark Chandler Calkins, both of Huntington Beach, all of Calif.

[73] Assignee: Dense-Pac Microsystems, Inc., Garden Grove, Calif.

[21] Appl. No.: 971,499

[22] Filed: Nov. 17, 1997

[51] Int. Cl.⁶ .......................... H01L 21/44; H01L 21/48; H01L 21/50

[52] U.S. Cl. .......................... 438/109; 438/110; 438/111; 438/113

[58] Field of Search ...................... 438/113, 111, 438/110, 109, 366, 368

[56] References Cited

U.S. PATENT DOCUMENTS

| | | | |
|---|---|---|---|
| 4,956,694 | 9/1990 | Eide | 357/74 |
| 5,313,096 | 5/1994 | Eide | 257/686 |
| 5,466,634 | 11/1995 | Beilstein, Jr. et al. | |
| 5,612,570 | 3/1997 | Eide et al. | 257/686 |

FOREIGN PATENT DOCUMENTS 56-88324  7/1981  Japan .

OTHER PUBLICATIONS

Ghandhi, Sorab K., VLSI Fabrication, John Wiley & Sons, Inc. p. 641, 1994.

Primary Examiner—John F. Niebling
Assistant Examiner—Josetta I. Jones
Attorney, Agent, or Firm—Loeb & Loeb LLP; John P. Scherlacher

[57] ABSTRACT

A method of making chip stacks begins with the formation of a plurality of panels having apertures therein and conductive pads on opposite sides thereof. Solder paste is deposited on the conductive pads prior to mounting plastic packaged IC chips within each of the apertures in each of the panels so that opposite leads thereof reside on the conductive pads at opposite sides of the apertures. The plural panels are then assembled into a stack, such as by use of a tooling jig which aligns the various panels and holds them together in compressed fashion. The assembled panel stack is heated so that the solder paste solders the leads of the packaged chips to the conductive pads and interfacing conductive pads of adjacent panels together, to form a panel stack comprised of a plurality of chip package stacks. Following cleaning of the panel stack to remove solder flux residue, the individual chip package stacks are separated from the panel stack by cutting and breaking the stack. Score lines across a topmost panel and transverse slots within remaining panels therebelow result in the formation of strips of chip package stacks when longitudinal cuts are made through the panel stack. The remaining portions of the uppermost panel within such strips are then snapped along the score lines thereof to separate the individual chip package stacks from the strips.

6 Claims, 5 Drawing Sheets

MODULAR PANEL STACKING PROCESS

BACKGROUND OF THE INVENTION

1. Field of the Invention

The present invention relates to methods of making chip stacks in which a plurality of integrated circuit chip packages arranged in a stack are electrically connected in a desired fashion.

2. History of the Prior Art

It is known to provide a chip stack in which a plurality of integrated circuit (IC) chips such as memory chips are formed into a stack arrangement and are electrically interconnected in desired fashion. Typically, the chips, which are included within packages therefor, have electrical contacts which are coupled in common or in parallel to contacts on a supporting substrate, as well as unique contacts which are coupled individually to the substrate to the exclusion of the other chips.

A number of different arrangements have been provided for electrically interconnecting IC chips in a stack. For example, electrical conductors which may comprise thin film metal on an insulating base may be disposed perpendicular to the planes of the planar chips so as to connect those conductors on each chip which are exposed through openings in an insulating layer. Where the chip packages are assembled into a stack, electrical connections may be accomplished by lead frames or solder strips extending along the sides of the stack and attached to the electrical contacts of the chips.

Another common technique for providing the desired electrical interconnections in a chip stack is to form a stack of chips having bonding pads disposed on the chips adjacent the outer edges thereof. After assembling the stack of chips, the chip edges are ground flat and polished before sputtering an insulating layer thereon. The bonding pads on the edges of the chips are masked during the sputtering process to avoid covering them with the insulating layer. Next, a metal layer is sputtered onto the entire edge of the stack in conjunction with photomasking which forms conductor traces of the metal layer in desired locations for connecting the bonding pads.

Still further examples of vertical stacks of IC chips and various methods of making such stacks are provided by U.S. Pat. Nos. 4,956,694, 5,313,096 and 5,612,570, which patents are commonly assigned with the present application. U.S. Pat. No. 5,612,570, which issued Mar. 18, 1997 and is entitled CHIP STACK AND METHOD OF MAKING SAME, describes a chip stack and a method for making the same in which chip packages are first assembled by mounting plastic packaged chips or thin, small outline package chips (TSOPs) within the central apertures of thin, planar frames having a thickness similar to the thickness of the packaged chip. Leads at opposite ends of the package are soldered to conductive pads on the upper surface of the surrounding frame. Each frame also has other conductive pads on the upper and lower surfaces thereof adjacent the outer edges of the frame, which are coupled to the conductive pads that receive the leads of the packaged chip by conductive traces and vias. A chip stack is then formed by stacking together a plurality of the chip packages and dipping the outer edges of the stack into molten solder to solder together the conductive pads adjacent the outer edges of the frames. The conductive pads adjacent the outer edges of the frames can be interconnected in a stair step arrangement, and pads on opposite sides of each frame can be coupled in offset fashion using vias, in order to achieve desired electrical interconnections of the various chip packages.

The chip stacks and the methods of making the same described in U.S. Pat. No. 5,612,570 have been found to be advantageous. The chip stack described therein is relatively easy to assemble using a simple process involving only a few steps. Moreover, a chip stack of relatively simple and economical configuration is provided. The stack is easily disassembled in the event that a defective chip must be replaced. Also, the design of the stack minimizes stresses occurring as a result of expansion and contraction of various materials within the stack and an attached substrate as the ambient temperature changes. The design of the stack provides the ability to electrically interconnect the chips in a manner which facilitates addressing of individual chips, such as for purposes of chip enabling as well as for common interconnection of other chip terminals.

However, it would be desirable to provide alternative methods of making chip stacks from plastic packaged or similarly packaged chips. In particular, it would be desirable to be able to make a large number of the chip stacks in simple and efficient fashion. While such chip stacks of U.S. Pat. No. 5,612,570 are relatively easy and simple to make, when compared with some of the much more complex stacks of the prior art; nevertheless, the chip stacks typically are made individually, one-at-a-time. First, each chip package is made by soldering the leads of the plastic packaged chip to the conductive pads after the chip is mounted within the frame. Then the chip packages are assembled into a stack and the edges of the stack are solder dipped in order to solder the individual chip packages together and form the stack. These steps must be repeated, over and over again, when a large number of the chip stacks are being made.

Accordingly, it would be advantageous to provide alternate methods of making chip stacks of the type described in U.S. Pat. No. 5,612,570. In particular, such methods should lend themselves to the simultaneous making of a large number of the chip stacks, so that a large number of the chip stacks may be made in a relatively speedy and efficient manner. At the same time, the methods should be capable of being carried out using industry standard processes and equipment.

BRIEF SUMMARY OF THE INVENTION

The foregoing objects and features are achieved in accordance with the invention by methods in which a plurality of the chip stacks are fabricated simultaneously using a single integrated structure and industry standard processing equipment in connection therewith. The individual chip stacks so formed are then easily separated from remaining portions of a panel stack structure to provide the individual chip stacks.

In a preferred method of making a chip stack in accordance with the invention, a plurality of panels are formed so that each has a plurality of apertures therethrough and a plurality of conductive pads formed on opposite surfaces of the panel adjacent each of the apertures. The opposite conductive pads are electrically interconnected in a desired pattern, such as by use of vias extending through the panel. Packaged IC chips, such as plastic packaged chips of the TSOP type, are mounted within the apertures of the panels so that the leads of the packaged chips are disposed on some of the conductive pads on the panel. A stack of the panels is then assembled, and the conductive pads of adjacent panels are bonded together as well as to the leads of the packaged chips, to form an integrated panel stack having a plurality of chip package stacks therein. Portions of the panel stack are then removed by a routing method, so that the individual chip package stacks are separated.

Mounting of the packaged chips within the panel apertures is done by any appropriate technique, such as standard pick and place machinery. Bonding of the leads of the packaged chips to the conductive pads of the panels and the conductive pads of adjacent panels to each other is done in a single soldering operation. To accomplish this, solder paste is deposited on the conductive pads, such as by use of a stencil printer, before the packaged chips are mounted within the apertures of the panels and the panels are assembled into a stack. By heating the stack, such as through use of a convection reflow oven, the solder paste solders the leads of the packaged chips to the conductive pads, and the conductive pads to each other, to form an integral panel stack structure. The panel stack is then cleaned to remove solder flux residue therefrom.

The individual chip package stacks are then separated from the panel stack. This is accomplished by removing unneeded portions of the panel stack which surround the chip package stacks therein. Cuts are made through the length of the panel stack, such as by use of a router, to separate the panel stack into strips of the chip package stacks. To facilitate separation of the chip package stacks within the strips, the panels are preferably formed with elongated slots therein on the opposite sides of the apertures in which the packaged chips are mounted. The slots are generally perpendicular to the cuts made through the panel stack, so that the individual chip package stacks tend to separate as the cuts are made through the panel stack. However, to prevent the individual chip package stacks from flying about, particularly when the cuts are made using a router or similar tool, the top panel of the panel stack is preferably made so that it does not have the elongated slots therein. Instead, such top panel is scribed along spaced-apart, generally parallel lines extending across the width of the panel stack so as to be generally perpendicular to the cuts made through the panel stack. Consequently, when the cuts are made, and the strips of chip package stacks are formed, the individual chip package stacks within each strip remain joined together until connecting portions of the top panel that remain are bent so as to break along the score lines and separate the chip package stacks of the strip from each other.

BRIEF DESCRIPTION OF THE DRAWINGS

A detailed description of the invention will be made with reference to the accompanying drawings, in which.

DETAILED DESCRIPTION

Figure 1:
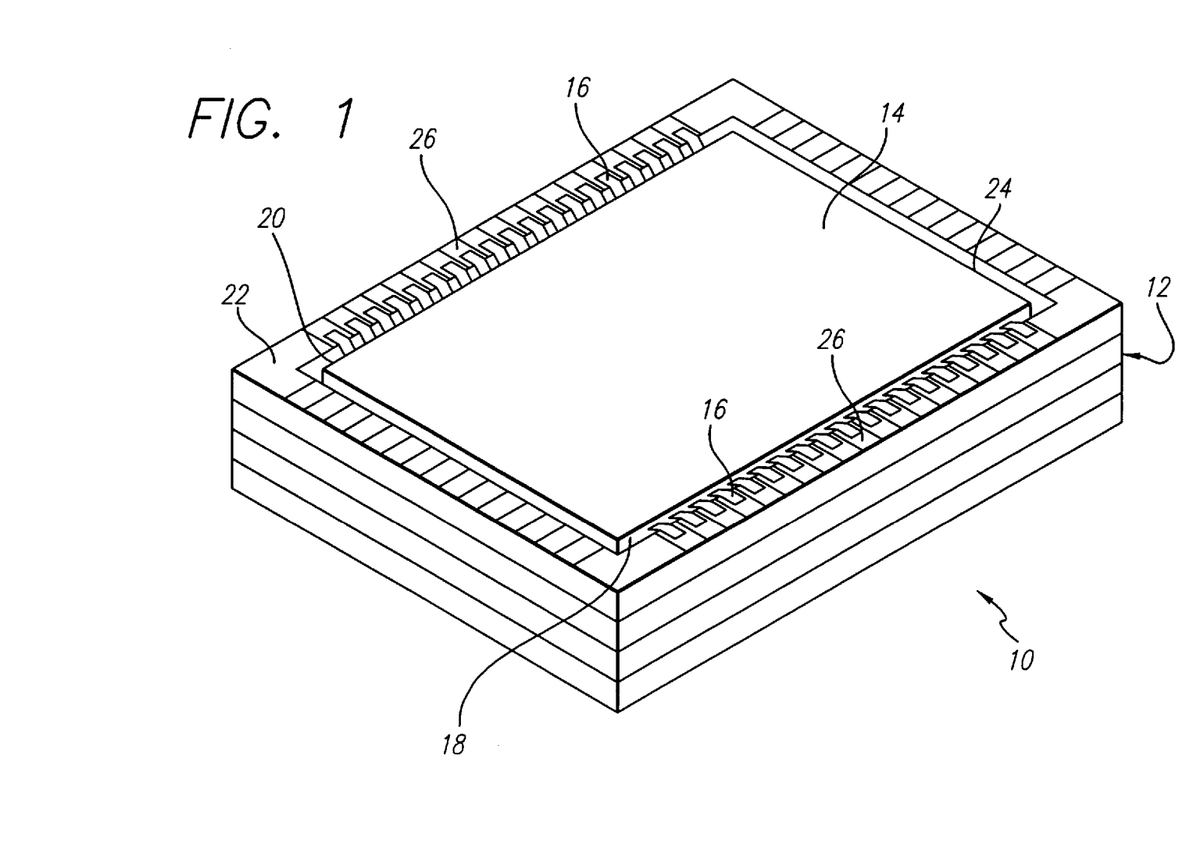
FIG. 1 is a perspective view of a chip package stack made using methods according to the invention.

FIG. 1 shows a chip package stack 10 of the type which may be made using the methods of the present invention. The chip package stack 10 is comprised of a stack of chip packages 12, of which there are four in the example of FIG. 1. Each chip package 12 includes an integrated circuit (IC) chip, which may be a memory chip and which is provided as a packaged chip 14 having leads 16 extending from opposite sides 18 and 20 thereof. In addition to the packaged chip 14, each chip package 12 includes a frame 22 having a central aperture 24 therein for receiving the packaged chip 14. The leads 16 extend from the opposite sides 18 and 20 of the packaged chip 14 onto a plurality of conductive pads 26 which are mounted along the frame 22. The packaged chips 14 within the chip package stack 10 may comprise plastic packaged chips of the type in which the IC chip or die is encapsulated within a thin, rectangular body of plastic material, with the leads of the chip extending from opposite side edges of the packaged chip. An example of such plastic packaged chips is the well-known TSOP (thin, small outline package). As described hereafter, the packaged chip 14 of each IC chip package 12 is mounted within the aperture 24 of the frame 22 thereof and is secured in place therein by soldering the leads 16 to the conductive pads 26 on the frame 22. With the packaged chip 14 so mounted within the frame 22, a small space remains between the side edges of the packaged chip 14 and the inner walls of the aperture 24. Because the packaged chip 14 and the frame 22 are typically made of different materials which expand and contract at different rates, the space allows for expansion and contraction due to changing temperatures, without buckling or distortion of the chip package 12.

As described hereafter, the opposite surfaces of each frame 22 are provided with the conductive pads 26. The leads 16 of the packaged chip 14 are bonded, such as by soldering, to only the conductive pads 26 on the upper surface of the frame 22. At the same time, the conductive pads 26 on the lower surface of the frame are bonded, such as by soldering, to the conductive pads 26 on the upper surface of the adjacent IC chip package 12 therebelow, so as to join the frames together. The soldering of the leads 16 of each packaged chip 14 to the conductive pads 26 on the upper surface of the surrounding frame 22, and the soldering of interfacing ones of the conductive pads 26 between adjacent ones of the frames 22, is preferably accomplished by depositing solder paste on the conductive pads 26 of the various frames, then mounting the packaged chips 14 within the apertures 24, then forming a stack of the IC chip packages 12, and then heating the stack to accomplish soldering, as described hereafter. The soldered conductive pads 26 at the interfaces between the frames 22 of the chip package stack 10 serve to provide electrical interconnections between the chip packages 12 of the stack 10. As in the case of the chip stack described in previously referred to U.S. Pat. No. 5,612,570, the conductive pads 26 on the opposite surfaces of each frame 22 may be connected in column-like fashion or in stair step-like fashion, such as through use of vias extending through the frame 22 to achieve a desired configuration of interconnections.

As described hereafter, methods in accordance with the invention make the chip package stack 10 simultaneously with many other chip packaged stacks 10 by assembling a stack of panels, each of which has a plurality of the apertures 24 therein, the conductive pads 26 formed thereon around each aperture, and a different packaged chip 14 mounted within each aperture 24. Following a heating step which solders the leads 16 of each of the packaged chips 14 to the adjacent conductive pads 26, and interfacing ones of the conductive pads 26 to each other, and cleaning of the panel stack to remove solder flux residue, the unneeded portions of the panels are removed, such as by cutting and breaking, to separate the individual chip package stacks such as the chip package stack 10 shown in FIG. 1.

Figure 2:
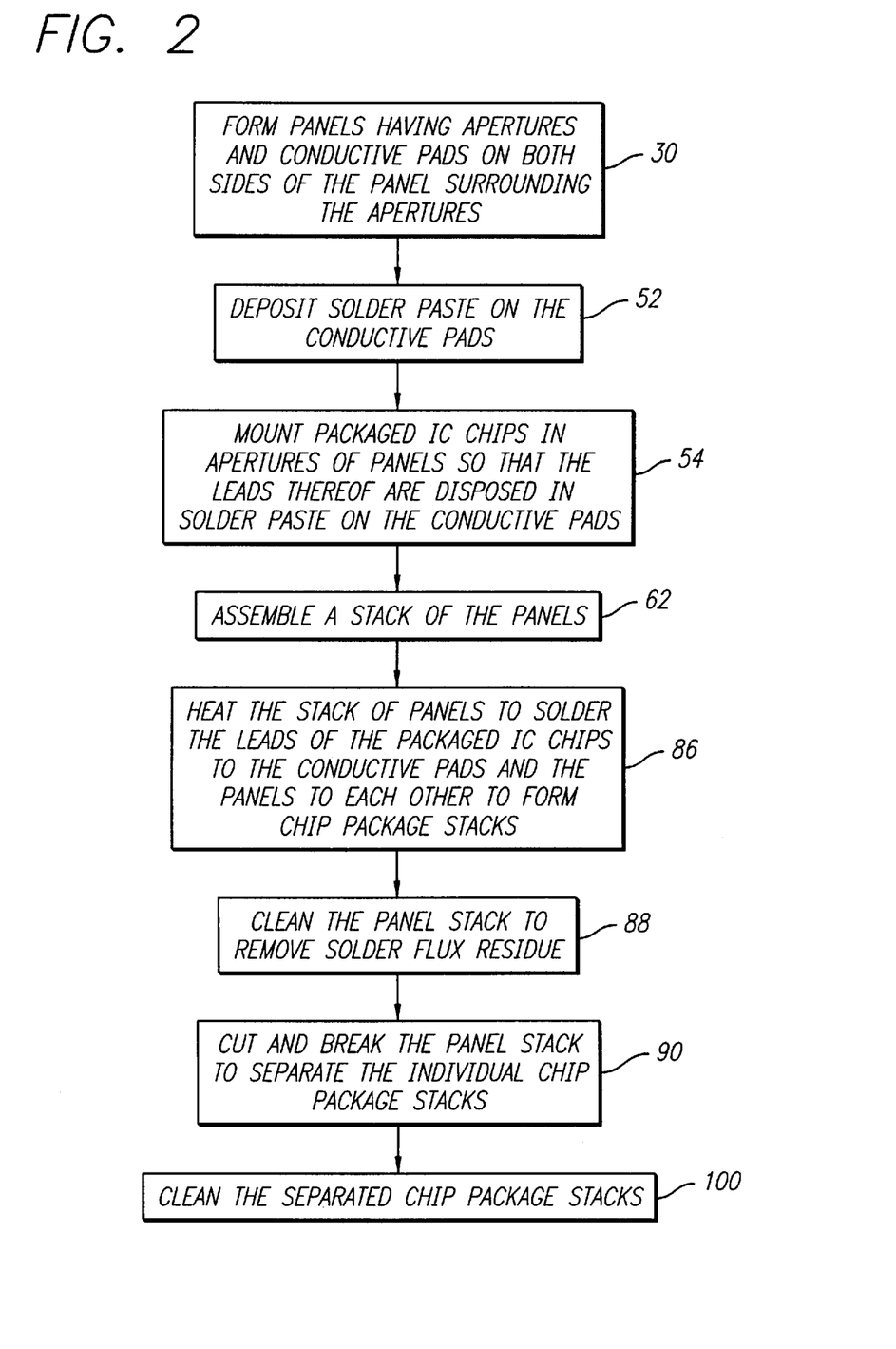
FIG. 2 is a block diagram of the successive steps of a preferred method of making a chip package stack in accordance with the invention, such as the stack shown in FIG. 1.
Figure 3:
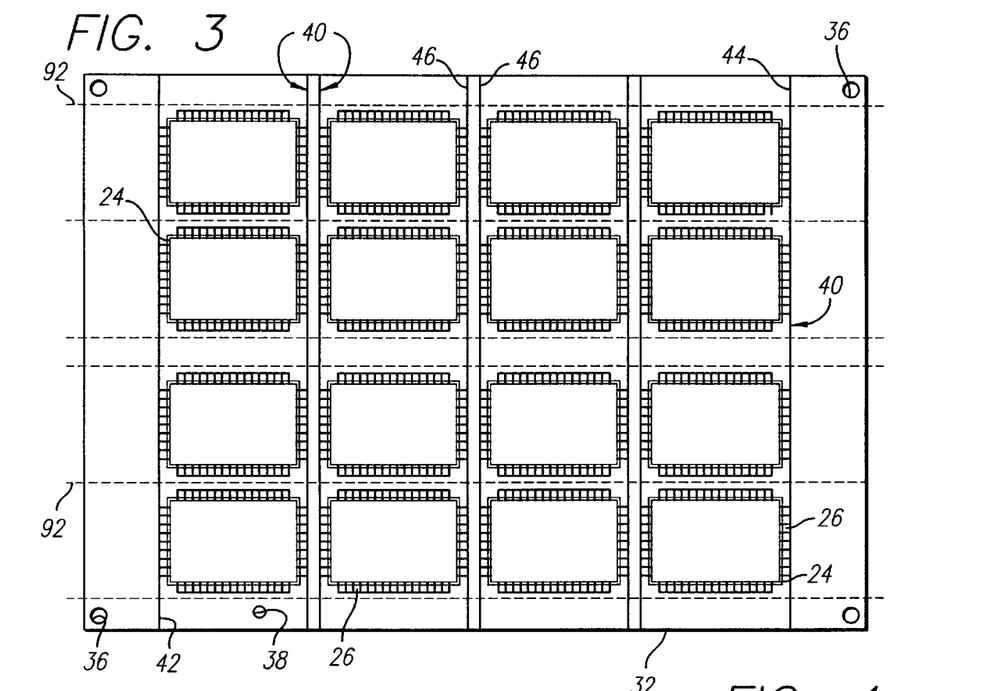
FIG. 3 is a plan view of a panel used to make a plurality of chip package stacks of the type shown in FIG. 1, in methods according to the invention.
Figure 4:
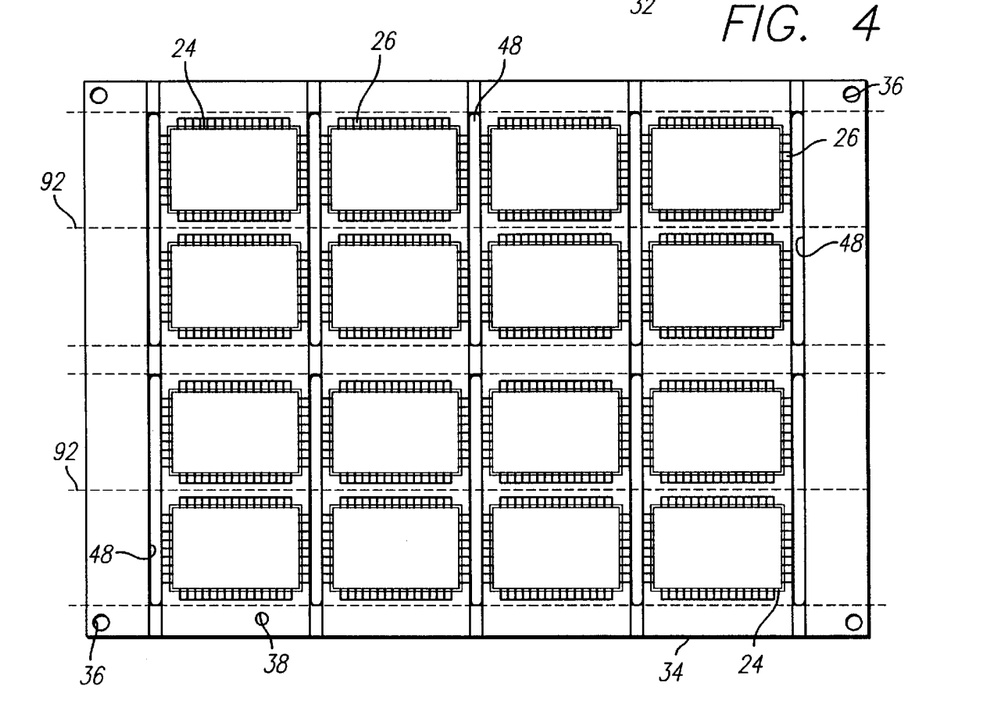
FIG. 4 is a plan view of a panel similar to and which is combined with the panel of FIG. 3 in accordance with methods of the invention, to make a plurality of chip package stacks such as shown in FIG. 1.

FIG. 2 shows the successive steps of a preferred method of making a chip package stack such as the stack 10 shown in FIG. 1. In a first such step 30, panels are formed with apertures therein and conductive pads on opposite surfaces thereof surrounding the apertures. Two such panels are shown in FIGS. 3 and 4. FIG. 3 shows a scored panel 32, while FIG. 4 shows a slotted panel 34. The panels 32 and 34 of FIGS. 3 and 4 are thin, planar, rectangular in shape, and of like size. The panels 32 and 34 are made of like material, such as PC board material. Each of the panels 32 and 34 is formed so as to have a like array of the apertures 24 formed therein. In the present example, sixteen of the apertures 24 are formed in each of the panels 32 and 34. The aperture arrays in the panels 32 and 34 are identical, so that the apertures 24 are aligned when the panel 32 is placed on top of one or more of the panels 34. In addition to the apertures 24, each of the panels 32 and 34 is provided with holes 36 at the four corners thereof, which holes are aligned when the panel 32 is placed on top of one or more of the panels 34. Also, the panels 32 and 34 each have a small hole 38 adjacent a side edge thereof. Again, the small holes 38 align when the panel 32 is placed over one or more of the panels 34. The apertures 24 may be formed using a routing machine, while the holes 36 and 38 may be formed by drilling.

The principal difference between the panels 32 and 34 is that the panel 32 is scored, whereas the panel 34 is slotted. The panel 32 has a plurality of scores 40 in the upper surface thereof, which extend along spaced-apart, generally parallel lines. The scores 40 extend transversely across the panel 32 so as to be generally perpendicular to the direction of elongation of the panel 32. The scores 40 include single scores 42 and 44 adjacent opposite ends of the panel 32, which are disposed just outside of the end groups of the apertures 24. The scores 40 also include several double scores 46 which extend between the various rows of the apertures 24 across the panel 32. As described hereafter, the various scores 40 in the panel 32 facilitate breakage therealong, following longitudinal cuts along an assembled stack of the panels 32 and 34, so as to facilitate separation of the individual chip package stacks 10.

Whereas the panel 32 has a pattern of the scores 40 in the upper surface thereof, and does not have slots therein, the panel 34 has no scores and instead has a plurality of transverse slots 48 therein. The slots 48 extend across the width of two columns of the apertures 24, so that two of the slots 48 extend across a substantial portion of the width of the panel 34 along a common axis thereof. The slots 48 are disposed between adjacent pairs of the apertures 24 within the rows of the apertures 24 across the width of the panel 34. Slots 48 are also formed adjacent opposite ends of the panel 34. As described in detail hereafter, the slots 48 within the panel 34 facilitate separation of the individual chip package stacks 10 from a stack formed from the panels 32 and 34. The slats 48 may be formed using a routing machine, when the apertures 24 are formed.

As previously noted, the panels 32 and 34 are formed with like arrays of the apertures 24 therein. Using well-known lithographic conductive trace formation techniques, the conductive pads 26 are formed on the panels 32 and 34. The conductive pads 26 surround the apertures 24 so as to be disposed at the four edges of each aperture 24. Although FIGS. 3 and 4 show only the upper surfaces of the panels 32 and 34, the conductive pads 26 are formed in like arrays on both the upper and the lower surfaces of each panel. During formation of the panels 32 and 34, the opposite conductive pads on each panel are interconnected, much in the same manner as opposite conductive pads adjacent the outer edges of the frame in U.S. Pat. No. 5,612,570 are interconnected. Typically, vias are used to connect the opposite conductive pads to form both columrn-like and stair step-like interconnections. Consequently, when a plurality of the panels 32 and 34 are stacked and interfacing conductive pads on adjacent panels are soldered together, a desired pattern of electrical interconnections is provided.

Referring again to FIG. 2, and having formed the panels 32 and 34 in accordance with the first step 30, a second step 52 is carried out by depositing solder paste on the conductive pads 26 formed on the opposite surfaces of the panels 32 and 34. The solder paste can be deposited by any appropriate technique, such as by use of a stencil printer to print the solder paste on the conductive pads 26. The soldering paste which is deposited can be any appropriate type of paste used to solder leads and conductive pads in IC board applications. Examples include tin/lead and tin/silver solder.

Figures 5, 6, 8:
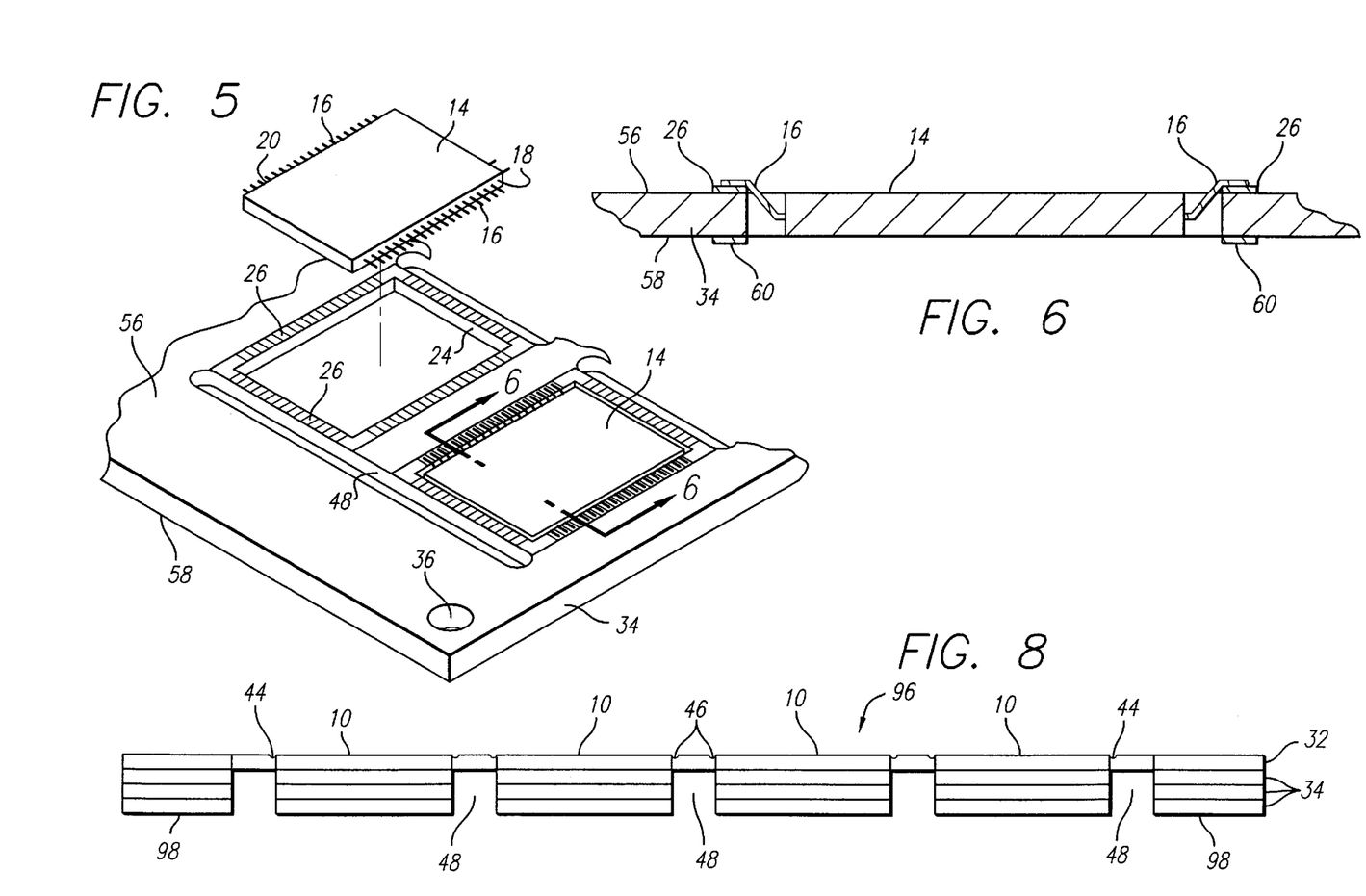
FIG. 5 is a perspective view of a portion of the panel of FIG. 4 showing the manner in which the packaged chips are mounted within apertures in the panels.
FIG. 6 is a sectional view of FIG. 5, taken along the line 6—6 thereof and showing the manner in which leads at opposite sides of the packaged chip are disposed on conductive pads on one surface of the panel.
FIG. 8 is a sectional view of one of a plurality of strips of chip package stacks formed as a result of cutting a panel stack formed by the tooling jig shown in FIG. 7.

Having deposited solder paste on the conductive pads 26, in the step 52 of FIG. 2, then in a following step 54 a plurality of the packaged chips 14 are individually mounted within the apertures 24 of the panels 32 and 34. As each packaged chip 14 is mounted in one of the apertures 24, the leads 16 extending from the opposite sides 18 and 20 thereof are disposed on adjacent ones of the conductive pads 26 on the upper surface of the panel and within the solder paste deposited on the conductive pads. This is illustrated in greater detail in FIGS. 5 and 6. FIG. 5 shows a portion of the panel 34 having two of the apertures 24 therein. As each packaged chip 14 is mounted within an aperture 24, the opposite leads 16 are placed onto the opposite conductive pads 26 at opposite sides of the aperture 24, and within the solder paste deposited on such pads. Because mounting of the packaged chips 14 within the apertures 24 can be a somewhat tedious and time consuming operation, it is preferably carried out by an automated process such as a conventional pick and place machine.

FIG. 6 is a sectional view taken along the line 6—6 of FIG. 5, and showing the manner in which the leads 16 at the opposite sides 18 and 20 of a packaged chip 14 extend outwardly and upwardly and with the outer ends thereof disposed on the conductive pads 26 on an upper surface 56 of the panel 34. As previously described, a lower surface 58 opposite the upper surface 56 is provided with an array of conductive pads which is like the array of conductive pads 26 on the upper surface 56 thereof. FIG. 6 shows two such conductive pads 60. At the same time that solder paste is deposited on the conductive pads 26, solder paste is also deposited on the conductive apads 60 at the lower surface 58. This facilitates soldering of the conductive pads 60 to adjacent conductive pads 26 on an upper surface 56 of an adjacent panel, after a stack of panels is assembled and the soldering operation is carried out, as described hereafter.

As shown in FIGS. 5 and 6, each of the packaged chips 14 is of thin, planar, rectangular configuration, and has a thickness like the thickness of the panel 34 so that it does not extend outwardly beyond the opposite upper and lower surfaces 56 and 58 of the panel 34. Similar considerations apply to the mounting of the packaged chips 14 within the apertures 24 in the panel 32 of FIG. 3.

Figure 7:
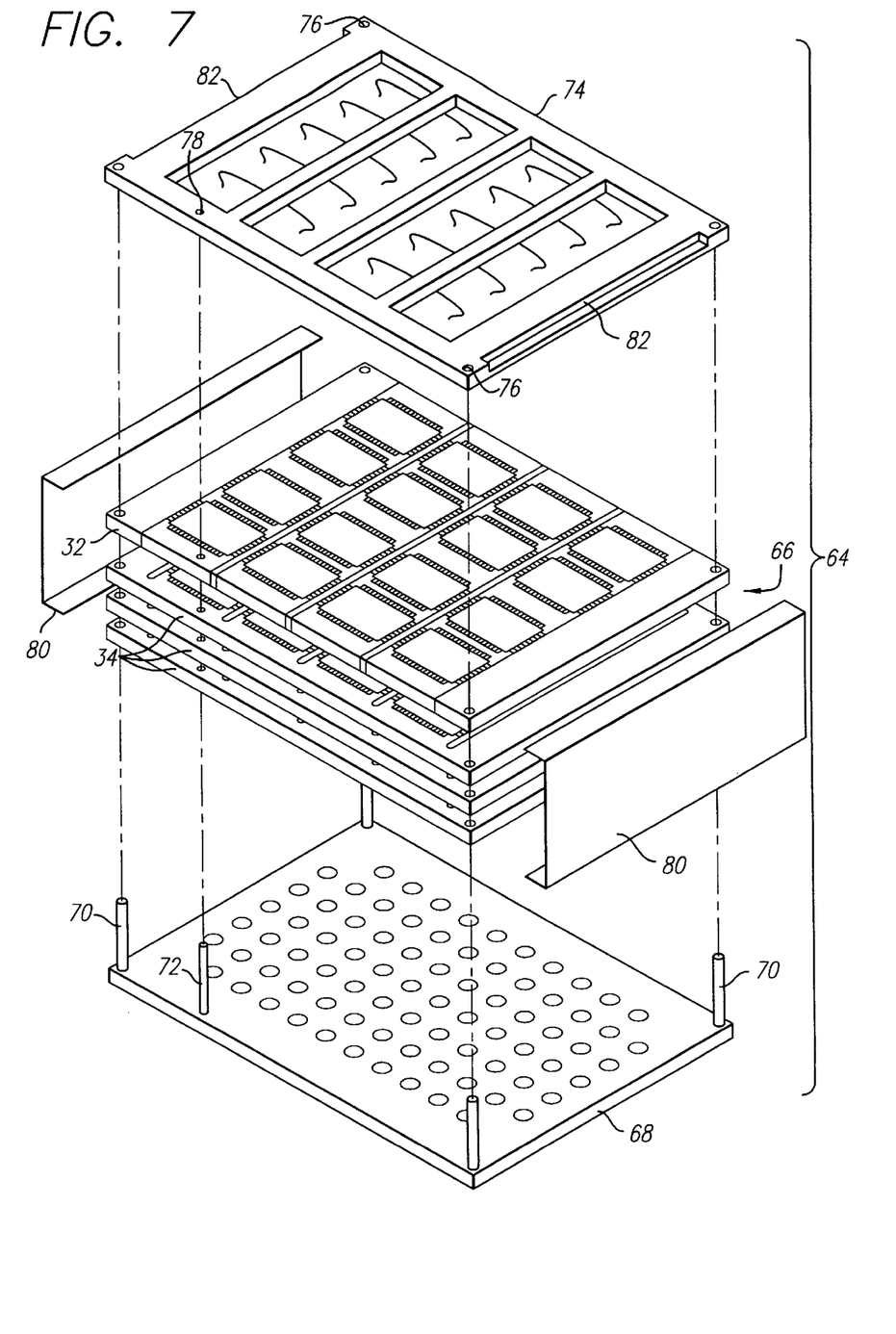
FIG. 7 is an exploded perspective view of a tooling jig which is used to assemble a stack of the panels shown in FIGS. 3 and 4 and during soldering of the leads of the packaged chips to conductive pads on the panels and of conductive pads on adjacent panels to each other.

Referring again to FIG. 2, and with the panels 32 and 34 formed in the step 30, solder paste deposited on the conductive pads 26 and 60 in the step 52, and packaged chips 14 mounted within the apertures 24 in the panels 32 and 34 in the step 54, then in a following step 62 a plurality of the panels are assembled into a stack. This may be done using a tooling jig 64 as shown in FIG. 7. In assembling the panel stack, the panel 32 of FIG. 3 is used as the topmost panel in the stack. One or more of the panels 34, shown in FIG. 4, is placed beneath the panel 32. In the present example, three of the panels 34 are used, and combined with the topmost panel 32 to form a four-panel stack 66. However, the number of the panels 32 used can vary depending upon the desired number of layers of the chip package stacks 10 being formed therefrom.

The tooling jig 64 includes a base 68 having a plurality of upwardly extending pins mounted thereon. The pins include pins 70 at each of the four corners of the rectangular base 68, and a smaller pin 72 mounted adjacent a side edge of the base 68. The stack 66 is assembled by placing the lowermost one of the panels 34 onto the pins 70 and 72 so that such pins extend through the holes 36 at the corners of the panel 34 and the hole 38 adjacent the side edge of the panel 34. One or more of the panels 34 are placed on the pins 70 and 72 in this manner. In the case of the panel stack 66, three of the panels 34 are mounted on the base 68 in this fashion. A single one of the panels 32 is then mounted on the pins 70 and 72 so as to form the uppermost panel of and complete the panel stack 66. Next, a top member 74 is placed over the top of the panel stack 66 so that the pins 70 and 72 extend through holes 76 at the opposite corners of the rectangular top member 74 and a hole 78 at a side edge of the top member 74.

The panel 32 and the panels 34 within the panel stack 66 are held together, in compression, using opposite C-shaped clips 80 which are made of resilient material. Opposite flanges extending from each of the clips 80 engage the base 68 and a recessed edge portion at one of the opposite ends of the top member 74. With the panel stack 66 so assembled and clamped within the tooling jig 64, a plurality of springs 84 mounted on the underside of the top member 74 provide a downward bias on the packaged chips 14 mounted in the uppermost panel 32, to hold such packaged chips 14 in place.

Referring again to FIG. 2, and in a next step 86, the panel stack 66 which is held in compressed fashion within the tooling jig 64 is heated so that the solder paste previously deposited in the step 52 effects desired soldering. The leads 16 of each of the packaged chips 14 are soldered to the adjacent conductive pads 26 on the panels 32 and 34 to complete the electrical interconnection thereof and to secure the packaged chips 14 within the apertures 24 in the panels 32 and 34. At the same time, the interfacing conductive pads 26 and 60 between adjacent ones of the panels 32 and 34 are soldered together, to bond the panel stack 66 together and at the same time complete the desired electrical interconnections between the various packaged chips 14 via the conductive pads 26 and 60. As previously described, the opposite conductive pads 26 and 60 of each panel are interconnected, such as by vias extending through the panel thickness. Consequently, when the interfacing conductive pads on adjacent panels are soldered together, the desired electrical interconnection is provided for the packaged chips 14 of each chip package stack 10 formed within the panel stack 66.

Any appropriate technique can be used to carry out the heating. The tooling jig 64 and its included panel stack 66 may be placed in a convection reflow oven, in an IR (infrared) oven, or vapor phase reflow can be used. In one example which uses a convection reflow oven, the tooling jig 64 is placed on a moving belt, so as to carry the tooling jig 64 through various zones within the oven. The tooling jig 64 takes approximately 4.5 minutes to move through the various zones of the oven, and is subjected to a desired temperature profile in which the ambient temperature surrounding it increases from approximately 25° C. to approximately 240° C., before decreasing to a lower level. This is sufficient to melt the metal content of the solder paste and accomplish the desired soldering.

Having heated the panel stack 66 in the step 86 of FIG. 2, then the panel stack 66 is removed from the tooling jig 64, and in a following step 88 is cleaned to remove solder flux residue therefrom. To remove the panel stack 66, the clips 80 are pulled from the opposite ends of the tooling jig 64, allowing the top member 74 to be lifted from the pins 70 and 72 of the base 68. The panel stack 66 can then be removed from the pins 70 and 72. In cases where the solder paste is water soluble, the cleaning step can comprise an aqueous system which preferably utilizes a mild detergent. The panel stack 66 can be placed within a series of baths. Alternatively, the panel stack 66 can be advanced by a belt while being subjected to aqueous sprays. Cleaning in this fashion for about six minutes removes most or all of the solder flux residue from the panel stack 66.

With the panel stack 66 formed in this fashion, the overlying packaged chips 14 and surrounding portions of the panel within the stack of panels 32 and 34 define a plurality of individual chip package stacks like the chip package stack 10 of FIG. 1. However, there remains the task of removing excess portions of the panels 32 and 34 within the panel stack 66 so as to separate out the individual chip package stacks 10. This is accomplished in accordance with the invention, in a next step 90 shown in FIG. 2, by cutting and breaking the panel stack 66. First, the panel stack 66 is repeatedly cut along a plurality of space-apart, generally parallel cut lines 92 which extend in a longitudinal direction along the length of the panels 32 and 34 within the panel stack 66. The cut lines 92 are represented by dotted lines in FIGS. 3 and 4. The cuts may be made using any appropriate technique, such as by use of a router. The cuts 92 extend along the outsides of and between the columns of the packaged chips 14 within the various panels 32 and 34. Making the cuts 92 separates the panel stacks 66 into strips of the chip package stacks 10. FIG. 8 is a side view of one of the strips which, in the present example, has four of the chip package stacks 10 therein. By using a router, the cuts 92 can be made so that they are just outside of the leads 16 and the conductive pads 26 at opposite side edges of each of the packaged chips 14.

The transverse slots 48 within each of the panels 34 act to separate the adjacent packaged chips 14 within each column thereof along the length of the panel 34, when the cuts 92 are made. Consequently, if the panel stack 66 were made entirely of the slotted panels 34, then the cuts 92 made by routing would completely separate the chip package stacks 10 from the panel stacks 66 as the cuts 92 are made. Because a router has a rotating bit, such an arrangement has a tendency to abruptly separate and even sling off the individual chip package stacks 10 as the cuts 92 are being made. This does not make for an orderly separation process, and can damage the chip package stacks 10. Use of the panel 32 as the topmost panel of the panel stack 66 prevents this from happening. As the cuts 92 are made through the panel stack 66, portions of the panel 32 hold the chip package stacks 10 together in strips of four, as shown in FIG. 8. The strips can then simply be flexed so as to break the joining portions of the panel 32 along the scores 40 thereof so as to separate the individual chip package stacks 10 from each other within the strips.

As noted, routing or other cutting of the panel stacks 66 along the cut lines 92 separates the panel stacks 66 into strips of the chip package stacks 10. One such strip 96 is shown in FIG. 8. The strip 96 is comprised of four chip package stacks 10 held together by the interconnecting portions of the topmost panel 32 which remain after the cutting is done. As shown in FIG. 8, the slots 48 in the panels 34 act to separate the chip package stacks 10 when the cuts 92 are made. However, the routing used to perform the cuts 92 does not completely separate the chip package stacks 10 within each strip 96 because of the scored interconnecting portions of the uppermost panel 32. By then flexing the chip package stacks 10 relative to each other and to remaining end portions 98 at the opposite ends of the strip 96, the interconnecting portions of the uppermost panel 32 are snapped or broken along the scores 44 and 46 therein to separate the chip package stacks 10 of the strip 96, as shown in FIG. 1.

Referring again to FIG. 2, and in a final step 100, the chip package stacks 10 separated from the panel stack 66 by the cutting and breaking step 90 are cleaned to remove any debris or residue that may remain from the step 90 or from earlier steps in the process. As in the case of the step 88, the cleaning can be carried out using an aqueous cleaning system with a mild detergent.

While the invention has been particularly shown and described with reference to a preferred embodiment thereof, it will be understood by those skilled in the art that various changes in form and details may be made therein without departing from the spirit and scope of the invention.

We claim:

1. A method of making chip stacks comprising the steps of:
   providing a plurality of panels, each having a plurality of apertures therein and a plurality of conductive pads thereon;
   providing a plurality of packaged chips having leads extending therefrom;
   mounting the plurality of packaged chips within the plurality of apertures in the plurality of panels so that the leads thereof are disposed on at least some of the plurality of conductive pads on the plurality of panels;
   assembling the plurality of panels into a panel stack;
   soldering the leads of the packaged chips to at least some of the plurality of conductive pads and at least some of the conductive pads on adjacent panels together to form chip package stacks within the panel stack; and
   separating the individual chip package stacks from the panel stack;
   wherein one of the plurality of panels is scored to facilitate breaking of the panel between adjacent chip package stacks, and the remaining ones of the plurality of panels have elongated slots therein to facilitate separation of adjacent chip package stacks; and
   wherein said one of the plurality of panels is scored along a plurality of spaced-apart, parallel score lines which are perpendicular to the elongated slots in said remaining ones of the plurality of panels, and the step of separating the individual chip package stacks includes the steps of cutting through the panel stack along a plurality of spaced-apart, parallel lines which are perpendicular to the score lines, to form a plurality of strips of the chip package stacks, and within each strip breaking the strip along the score lines of a portion of said one of the plurality of panels within the strip to separate the individual chip package stacks from the strip.

2. A method of making chip stacks comprising the steps of:
   providing a plurality of thin, planar panels, each having a plurality of apertures therein, a plurality of conductive pads on opposite surfaces of the panel adjacent each of the plurality of apertures, and a plurality of slots therein on opposite sides of each of the plurality of apertures;
   mounting a different one of a plurality of packaged chips having leads within each of the plurality of apertures of each of the plurality of panels;
   assembling the plurality of panels into a panel stack;
   bonding the leads of the plurality of packaged chips to at least some of the plurality of conductive pads of the panels on which the packaged chips are mounted, and bonding at least some of the plurality of conductive pads of each panel to at least some of the conductive pads on at least one adjacent panel of the plurality of panels to form chip package stacks within the panel stack; and
   cutting through each of the plurality of panels within the panel stack along lines perpendicular to the plurality of slots in each of the panels to separate the chip package stacks from the panel stack.

3. The method set forth in claim 2, wherein one of the plurality of thin, planar panels is formed without the pluralit of slots therein and is broken following the cutting step to separate the chip package stacks.

4. The method set forth in claim 2, wherein the plurality of apertures in each panel are arranged into columns thereof extending along a length of the panel and rows thereof extending across a width of the panel and the plurality of slots in the panel are located between adjacent rows of the apertures.

5. The method set forth in claim 4, wherein the step of cutting is performed by cutting through each panel of the panel stack along the length of the panel adjacent opposite sides of the columns of apertures.

6. The method set forth in claim 2, wherein each of the plurality of apertures in each of the panels is of rectangular configuration so as to have four side edges which are surrounded by the conductive pads on each of the opposite sides of the panel, and each of the packaged chips comprises a thin, small outline chip package of rectangular configuration having plural leads extending from a pair of opposite side edges of the package and onto the conductive pads adjacent an opposite pair of side edges of an aperture in which the chip package is mounted, the chip package having a thickness like a thickness of the panel between opposite sides of the panel.

* * * * *